United States Patent [19]

Byer et al.

[11] 4,421,721
[45] Dec. 20, 1983

[54] APPARATUS FOR GROWING CRYSTAL FIBERS

[75] Inventors: Robert L. Byer, Stanford; Martin M. Fejer, Palo Alto, both of Calif.

[73] Assignee: The Board of Trustees of the Leland Stanford Junior University, Stanford, Calif.

[21] Appl. No.: 308,161

[22] Filed: Oct. 2, 1981

[51] Int. Cl.³ .................... C30B 15/14; C30B 15/32
[52] U.S. Cl. .................................. 422/109; 422/249; 156/617 M; 156/DIG. 80; 156/DIG. 98
[58] Field of Search ........ 156/601, DIG. 80, DIG. 62, 156/DIG. 98, 617 M; 422/107, 108, 109, 249

[56] References Cited

U.S. PATENT DOCUMENTS

| 3,159,408 | 12/1964 | Sanchiz et al. | 156/DIG. 98 |
| 3,865,564 | 2/1975 | Jaeger et al. | 156/DIG. 80 |
| 3,944,640 | 3/1976 | Haggerty et al. | 156/DIG. 80 |
| 3,957,474 | 5/1976 | Kobayashi | 156/DIG. 80 |
| 4,040,890 | 8/1977 | Burrus et al. | 156/DIG. 80 |

FOREIGN PATENT DOCUMENTS 54-134083 10/1979 Japan .................... 156/DIG. 98

Primary Examiner—Hiram H. Bernstein
Attorney, Agent, or Firm—Flehr, Hohbach, Test, Albritton & Herbert

[57] ABSTRACT

Apparatus for growing crystal fibers comprises a housing, a first drive within the housing for supporting and driving a feed rod, and a second drive within the housing for supporting and driving a fiber. Each of the drives includes a vacuum chuck having first and second support surfaces oriented generally perpendicular and defining a line of intersection, a vacuum provided along the line of intersection for retaining either a rod or a fiber in abutment with the first and second support surfaces, and roller means for driving the rod and fiber along the line of intersection. The apparatus further includes a first laser for generating a laser beam and transmission optics for transmitting the laser beam to the housing. Optics within the housing receives and expands the laser beam into a generally annular configuration and focuses the laser beam on an end of the feed rod. The optics includes a refraxicon portion having inner and outer conical reflecting surfaces for receiving a round laser beam and forming an annular laser beam, an elliptical mirror for receiving the annular laser beam from the refraxicon portion and directing the annular laser beam to a parabolic mirror which focuses the annular laser beam on the end of the feed rod. The diameter of the fiber is controlled by the speed of the first and second drives, and a control signal for the drives is obtained by a monitor which receives a laser beam transmitted through the fiber and generates signals in response to fringes of light from the fiber, the spacing of the fringes being indicative of fiber diameter.

6 Claims, 10 Drawing Figures

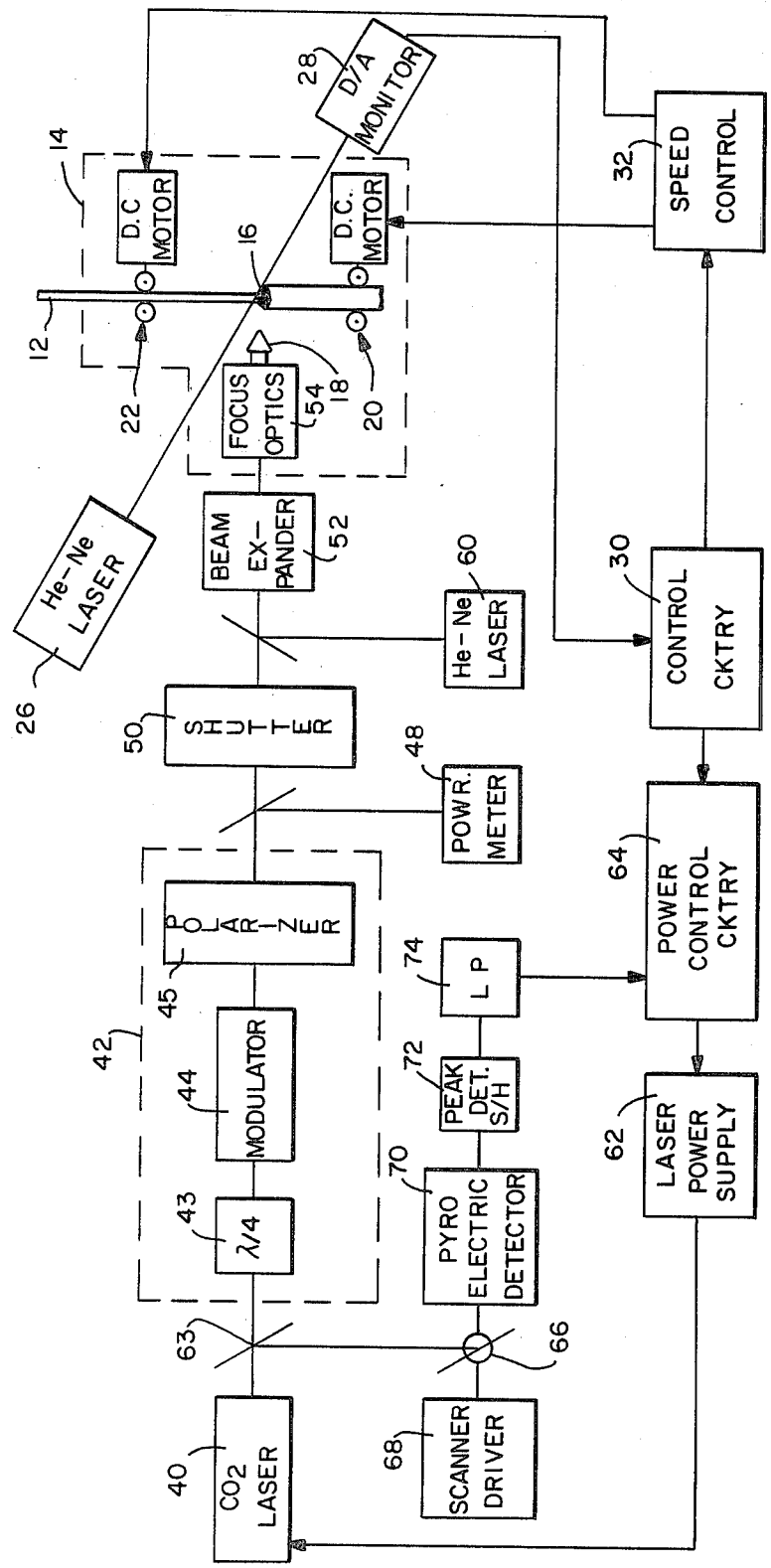
FIG.—1

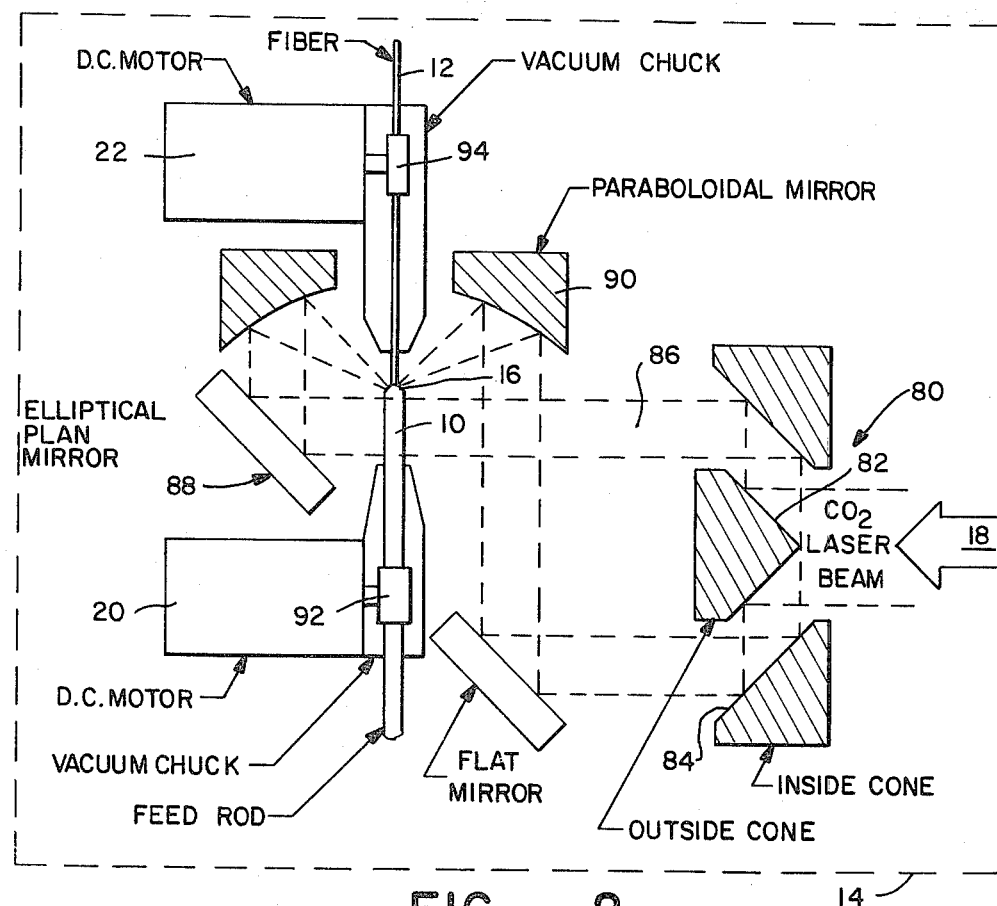
FIG.—2
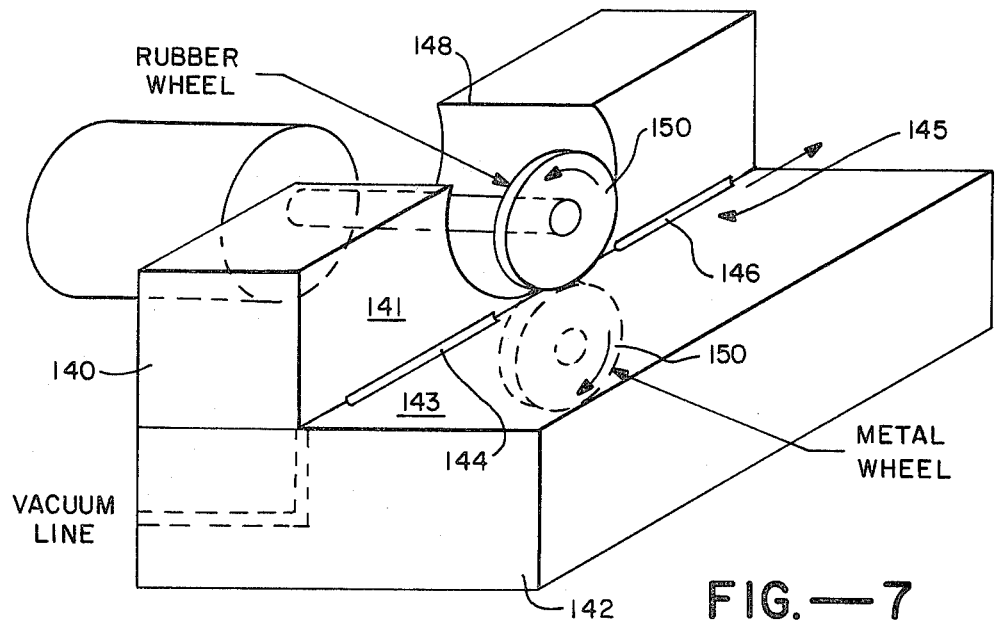
FIG.—7

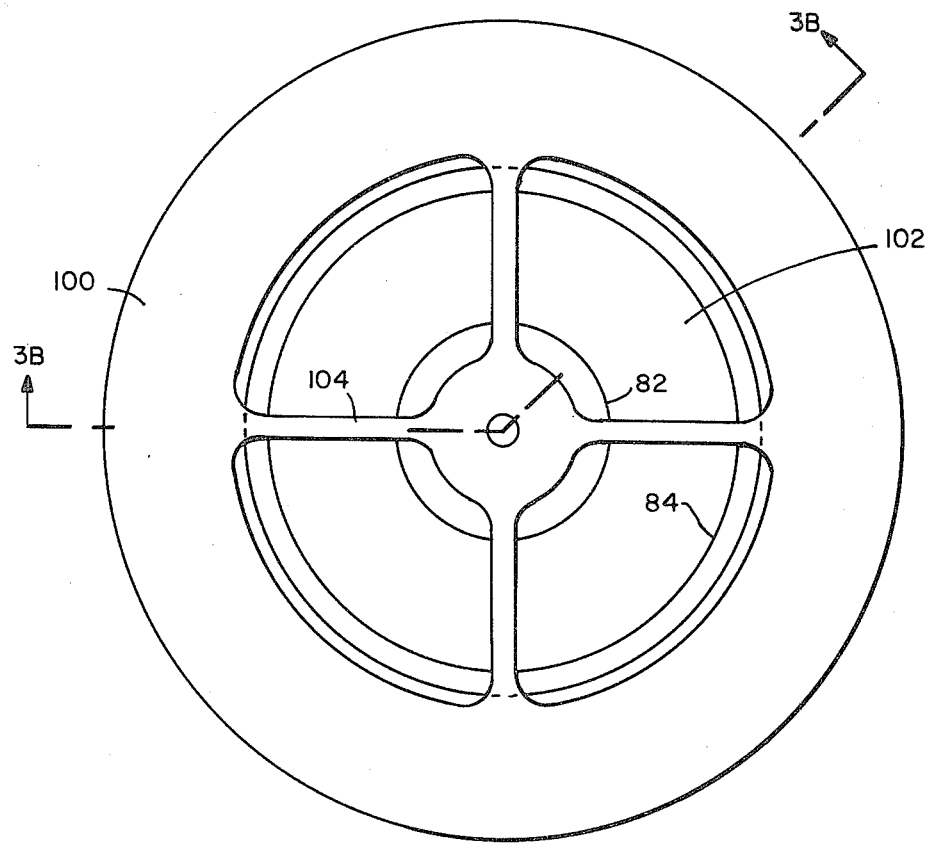
FIG.—3A
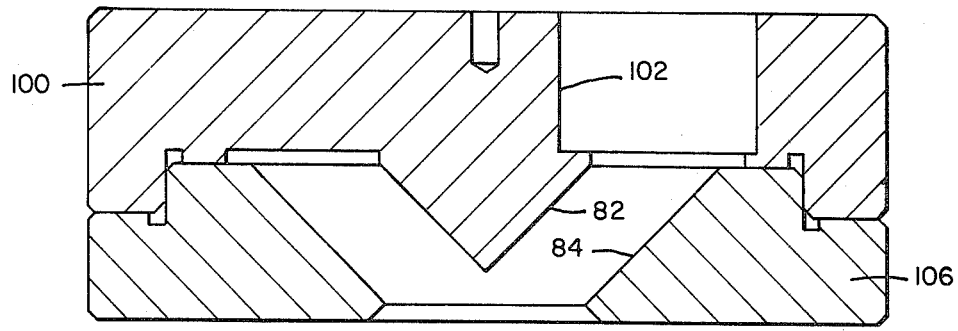
FIG.—3B

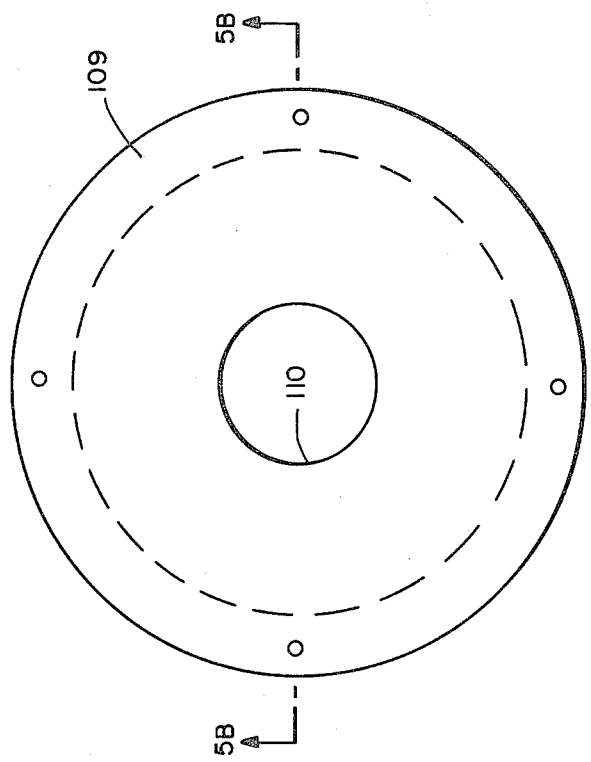
FIG.—5A
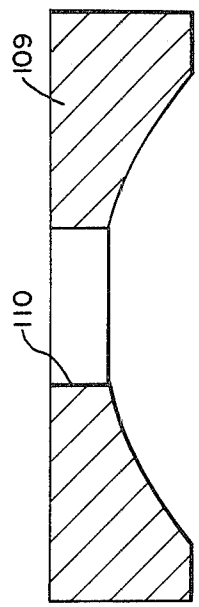
FIG.—5B
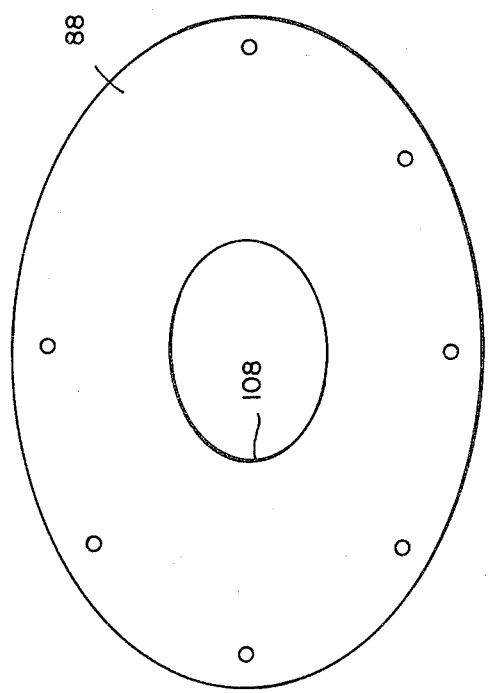
FIG.—4A
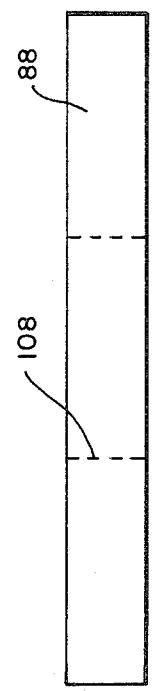
FIG.—4B

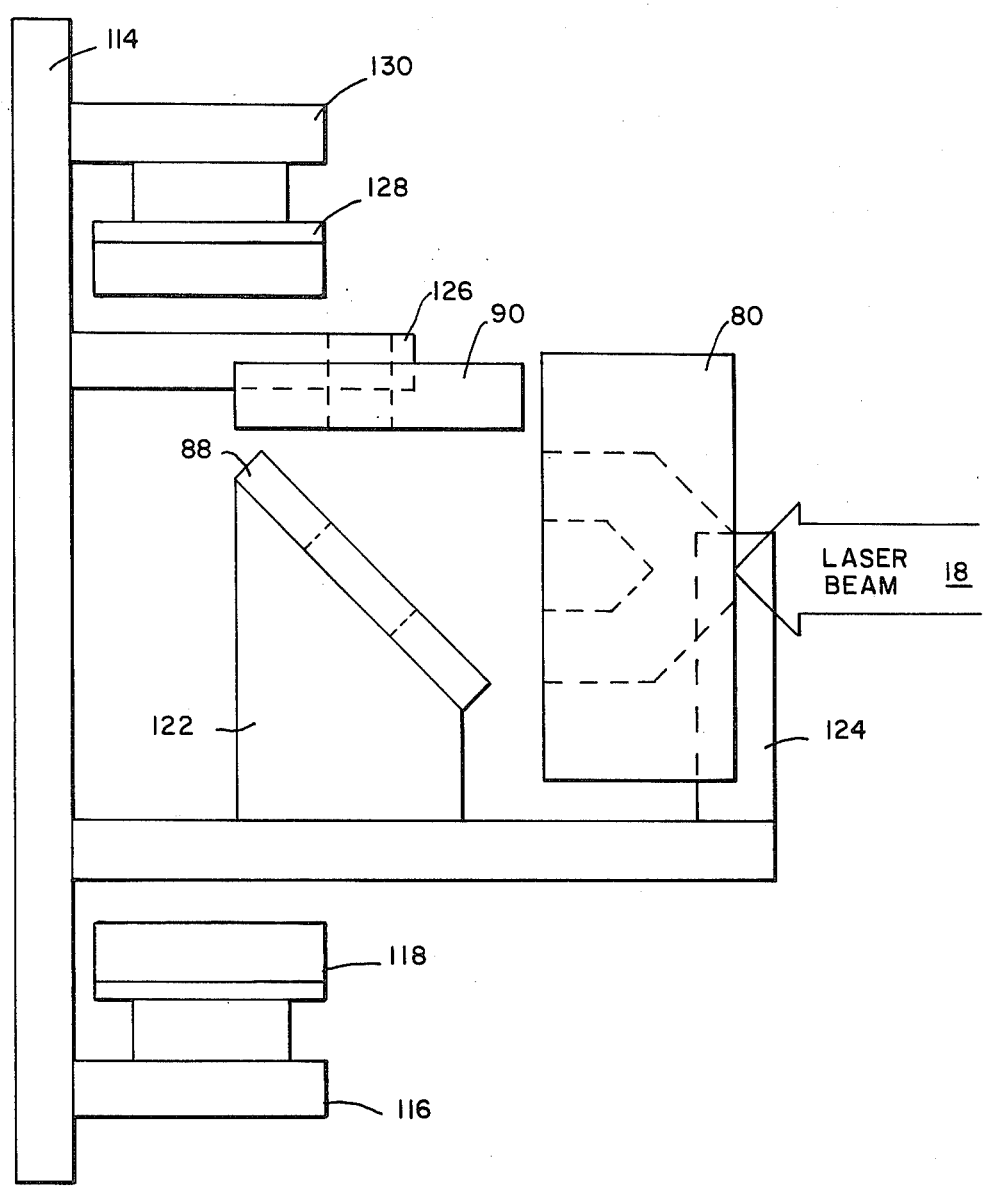
FIG.—6

APPARATUS FOR GROWING CRYSTAL FIBERS

The U.S. government has rights in the disclosed and claimed invention pursuant to Department of Navy Contract AF F49620-81-C-0047.

This invention relates generally to improved apparatus for growing crystal fibers useful in optical devices.

Single crystal fibers are presently being studied for use in a variety of optical applications. The unique combination of single crystal material properties and fiber geometry offer intriguing capabilities in a variety of optical devices. Three materials have been successfully grown in the Center for Materials Research at Stanford University which typlify the broad range of potential applications. The large non-linear coefficients of LiNbO$_3$ suggests a number of modulators, signal processors, and parametric sources. Miniature lasers made from Nd:YAG fibers are known and could be used as in line amplifiers in conjunction with conventional glass fiber systems. Sapphire has a high melting point, mechanical strength, resistance to chemical attack, and favorable optical fiber properties which make it an excellent candidate for monitoring temperature or optical radiation in hostile environments and for guiding high power optical beams.

Apparatus presently in use for growing crystal fibers utilizes a pair of lasers focused in the end of a rod. A seed crystal is dipped into the molten bead formed on the rod, and then the seed crystal is withdrawn at a constant rate to pull a single crystal fiber. Both the rod and seed crystal are chucked to lead screws, and the feed rate of the rod and the pull rate of the seed crystal are adjusted to achieve a desired fiber cross section. Typically, a diameter reduction of two to five is feasible, and by using three to five regrowth cycles a fiber can be obtained having a diameter less than 100 microns.

Fibers have been grown with diameters ranging from 500 microns down to 35 microns in lengths up to 15 centimeters. Growth rates are typically 1–10 millimeter per minute. Oriented fibers have been grown including [111], [110] and [100] Nd:YAG; [100], [001] LiNbO$_3$; and [100], [001] sapphire. The fibers tend to exhibit cross sections similar to those of Czolchralski grown bulk boules with the Nd:YAG having a hexagonal cross section and the LiNBO$_3$ being elliptical in cross section.

A major problem with present apparatus is fiber growth instability which leads to fibers having diameters varying by 5% over 5 millimeter lengths and 10% or more over larger lengths. Scanning electron micrographs have shown that the diameter variations have a broad spectrum ranging from millimeter periods down to sub-micron. The fluctuations in fiber diameter has resulted from variations in the heating of the rod and the movement of the rod fiber. Particularly, since it is necessary to rotate the rod to maintain a uniform melt and rotate the seed crystal in pulling the fiber, it is impossible to maintain the rod and seed concentric, thus leading to a spiral appearance on the surface. Higher frequency diameter variations are associated with laser power fluctuations particularly when the lasers are operated near a threshold during small diameter fiber growth.

Accordingly, an object of the present invention is improved apparatus for growing crystal fibers.

Another object of the invention is means for more uniformly heating a feed rod in crystal fiber growing apparatus.

Still another object of the invention is improved means for moving a rod to maintain a uniform melt and for pulling a fiber to attain a uniform fiber diameter.

Yet another object of the invention is improved measuring and feedback means for controlling laser intensity and movement of the rod and fiber and maintaining a uniform fiber diameter.

Briefly, in accordance with the invention apparatus for growing crystal fibers includes a housing, first drive means within the housing for supporting and driving a feed rod, and second drive means within the housing for supporting and driving a fiber. At first means outside of the housing generates a laser beam, and transmission means transmits the laser beam to the housing. Optical means within the housing receives and expands the laser beam into a generally annular configuration, and focusing means within the housing focuses the laser beam on an end of the feed rod.

In accordance with one feature of the invention the optical means within the housing includes a refraxicon portion having inner and outer conical reflecting surfaces for receiving a round laser beam and forming an annular laser beam. An elliptical mirror receives the annular laser beam from the refraxicon portion and directs the annular beam to a parabolic mirror, the parabolic mirror focusing the annular laser beam on the end of the feed rod.

In accordance with another feature of the invention the first drive means and the second drive means each includes a vacuum chuck with the vacuum chuck having first and second support surfaces oriented generally perpendicular and defining a line of intersection. Vacuum means is provided along the line of intersection for retaining the rod and fiber in abutment with the first and second support surfaces. Roller means is provided for driving the rod and fiber along the line of intersection.

In accordance with another feature of the invention monitoring means is provided for monitoring the diameter of a fiber and generating a signal for controlling the speed of the drive means and controlling the amplitude of the first laser means. More particularly, the monitoring means includes a second laser means for generating a second laser beam and directing the second laser beam through the fiber, and optical receiver means for receiving the second laser beam after passing through the fiber and generating a signal indicative of fiber diameter. The optical receiver means detects fringes of light from the fiber with the spacing of the fringes being indicative of fiber diameter.

The invention and objects and features thereof will be more readily apparent from the following detailed description and appended claims when taken with the drawings, in which:

FIG. 1 is a block diagram of apparatus for growing single crystal fibers in accordance with the invention.

FIG. 2 is a section view of the optics used in uniformly heating a feed rod in the apparatus of FIG. 1.

FIG. 3A and FIG. 3B are a front view and section view, respectively, of a refraxicon in the optics of FIG. 2.

FIG. 4A and FIG. 4B are a top view and a side view, respectively, of an elliptical mirror in the optics of FIG. 2.

FIG. 5A and FIG. 5B are a top view and a section view, respectively, of a paraboloid mirror in the optics of FIG. 2.

FIG. 6 is a side view of support structure in the apparatus of FIG. 1.

FIG. 7 is a perspective view of a vacuum chuck useful in the apparatus of FIG. 1.

Referring now to the drawings, FIG. 1 is a functional block diagram of apparatus for pulling crystal fibers in accordance with the invention. A feed rod 10 and the grown fiber 12 are positioned in an enclosed chamber shown generally at 14 with a molten bead 16 formed at the end of rod 10 by means of a laser beam shown generally at 18. Rod 10 is fed into the laser beam as the fiber 12 is grown by means of dc motor driven rollers shown generally at 20. The fiber 10 is withdrawn from the bead 16 by means of dc motor driven rollers shown generally at 22.

The beam 24 from a helium neon laser 26 is directed through the fiber 12 near the vicinity of bead 16, and the laser beam is received by a diameter monitor 28 which generates a feedback signal to control circuitry 30, as will be described further hereinbelow. The control circuitry 30 responds to the signal from diameter monitor 28 and controls the speed of the dc motor drives 20 and 22 through motor speed control circuitry 32 and controls the amplitude of the laser 40 through the power control circuitry 64, thereby maintaining the desired fiber diameter.

The laser beam 18 for heating the rod 10 is obtained from a laser source 40. Laser 40 may be a commercially available 20 watt $CO_2$ laser from California Laser Corporation. The output of laser 40 is applied through a conventional attenuator shown generally at 42 and including a quarter wave plate depolarizer 43, a cadmium teluride (CdTe) electro-optic modulator 44, and a polarizer 45. The modulator 44 is a birefringence polarizer responding to a control voltage to polarize and orient the beam from laser 40 with respect to the fixed polarizer 45 to control the beam output from the attenuator 42. The output power is monitored by a power meter 48.

The output of attenuator 42 is applied through an on/off shutter 50 to a beam expander 52 and thence to the focus optics 54 which forms the requisite laser beam 18 transmission through a window in housing 14 to mirrors for uniformly heating the rod 16. The internal mirrows will be described further with reference to FIGS. 2–5. Since the beam from the $CO_2$ laser 40 is invisible another laser beam from a helium-neon laser 60 is applied in parallel with the beam from laser 40 through the beam expander 52 and the focus optics 54 for visual inspection by a human operator. Shutter 50 allows the operator to work in the chamber 14 without the necessity of turning off the laser source 40.

The laser power supply 62 for the laser 40 is controlled by a power control circuit 64 which responds to a power set point signal from the control circuitry 30 and a power monitor signal derived from the output of the laser 40. More particularly, a portion of the output of laser 40 is applied by beam splitter 64 to a scanning mirror 66 which is driven by a scanner driver 68. Scanner driver 68 sinusoidally rotates mirror 66 with the reflected beam from mirror 66 being received periodically by the pyroelectric detector 70. The pyroelectric detector 70 responds to the periodic incident laser beam and generates a plurality of pulses in response to the magnitudes of the incident beams and the pulses are applied to a peak detect and hold circuit 72. The output signal from sample and hold circuit 72 is then applied through a low pass filter 74 which generates a time varying dc control voltage to the power servo 64. A suitable scanner and pyrodetector are commercially available from American Time Products Corporation and Molectron Corporation, respectively.

The control signals from the control circuitry 30 are derived from the diameter monitor circuitry 28 which responds to the helium neon laser beam 24 which passes through the fiber 12. A plurality of fringes are generated by the refraction of the beam 24 in passing through the crystal fiber 16, the spacing of the fringes being dependent on the diameter of the fiber 16. See, for example, D. H. Smithgall, "High Speed Non-Contact Fiber Diameter Measurement Using Forward Light Scattering", *Applied Optics*, Vol. 16, 1977, pgs. 2395–2402. The diameter monitor 28 responds to the number of fringes within a given angle and the particular positioning of a fringe and generates a signal which is indicative of the diameter of the fiber 12. The exact positioning of the fringe can be obtained using a Reticon diode array in the monitor.

Referring now to FIG. 2, the mirrors within the chamber 14 for uniformly heating the feed rod is shown in cross section. The input beam 18 enters the chamber 14 through a window and is intercepted by a refraxicon shown generally at 80 which includes a first conical surface 82 and a second conical surface 84 which expands the beam and generates a generally annular beam 86. The annular beam 86 is intercepted by an elliptical planar mirror 88 inclined at 45° to direct the beam 86 to a paraboloidal mirror 90 which focuses the laser beam on the molten bead 16 at the tip of rod 10. As described with reference to FIG. 1, the rod 10 is fed by means of the dc motor drive 20 and the fiber 12 is extracted by the dc motor drive 22. As will be described further hereinbelow with reference to FIG. 7, the rod 10 and the fiber 12 are maintained in concentric alignment by means of vacuum chucks shown generally at 92 and 94, respectively.

Referring to FIGS. 3A and 3B a front view and side view in section of the refraxicon 18 are shown. The outside conical surface 82 is provided on a first member 100 with windows 102 provided between support ribs 104 for exiting the beam. The inside conical surface 84 is formed on a second member 106 which mates with the first piece 100. Both the piece 100 and 106 are preferably diamond turned copper which provides the requisite smooth surface for expanding and directing the laser beam.

A top view and a side view, of the elliptical mirror 88 are shown respectively in FIGS. 4A and 4B. Again, the mirror is preferably formed from diamond turned copper and includes a central opening 108 through which the feed rod passes.

A top view and section view of the paraboloidal mirror 90 are shown in FIGS. 5A and 5B, respectively. The paraboloidal mirror has a central opening 110 through which the fiber is extracted. Again, mirror 90 is preferably formed from diamond turned copper.

FIG. 6 is a side view of support structure for the apparatus of FIG. 2. Extending from a vertical support plate 114 is a first cantelivered member 116 which supports an X-Y table 118 on which the drive motor and chuck are mounted. A second cantelivered member 120 includes a pedestal 122 on which the elliptical mirror 88 is mounted. A second support member 124 extends from the cantelivered member 120 to support the refraxicon 80. The paraboloidal mirror 90 is supported on a cantelivered member 126, and the dc drive motor 22 and chuck 94 for the fiber are mounted on an X-Y table 128 which extends from cantelivered member 130. The X-Y tables allow accurate positioning of the rod and fiber with respect to the focused laser beam and permits concentric alignment of the rod and fiber as the fiber is extracted from the molten bead on the rod.

Because of the difficulty in driving the fine crystal fiber and rod, a special vacuum chuck is provided for driving the fiber and rod. FIG. 7 is a perspective view of the vacuum chuck which includes a first member 140 and a second member 142 which define right angle surfaces 141 and 143 and a commmon edge 145. A vacuum line is provided to the links 144 and 146 of the line 145 to maintain the fiber, or rod, in abutment with the surfaces 141 and 143. The portion 140 includes a central notched portion 148 with a rubber drive wheel 150 positioned over the line 145 and abuting a metal idler wheel 150 within the portion 142. Thus, by rotating the wheel 150 the crystal fiber can be driven along the line 145 with the vacuum chuck maintaining and supporting the fiber in engagement with the surfaces 141 and 143. As the fiber is driven from the vacuum chuck the length of fiber can be wound on a takeup drum.

Apparatus in accordance with the invention allows fabrication of increased lengths of crystal fibers having a more uniform diameter. Improved uniform heating of the feed rod is obtained by the optics and control circuitry of the apparatus, and better control of the feed of the rod and withdrawal of the fiber is provided.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. Apparatus for growing crystal fibers comprising
a housing,
first drive means within said housing for supporting and driving a feed rod,
second drive means within said housing for supporting and driving a fiber,
first laser means for generating a laser beam,
transmission means for transmitting said laser beam to said housing, and
optical means within said housing for receiving and expanding said laser beam into a generally annular configuration and focusing said laser beam on an end of said feed rod, said optical means including a refraxicon portion having inner and outer conical reflecting surfaces for receiving a round laser beam and forming an annular laser beam, an elliptical mirror and a parabolic mirror, said elliptical mirror receiving said annular laser beam from said refraxicon portion and directing said annular laser beam to said parabolic mirror, said parabolic mirror focusing said annular laser beam on said end of said feed rod.

2. Apparatus as defined in claim 1 wherein said first drive means and said second drive means each includes a vacuum chuck, said vacuum chuck having first and second support surfaces oriented generally perpendicular and defining a line of intersection, vacuum means provided along said line of intersection for retaining said rod and fiber in abutment with said first and second support surfaces, and roller means for driving said rod and fiber along said line of intersection.

3. Apparatus as defined by claim 2 and further including monitoring means for monitoring the diameter of a fiber and generating a signal for controlling the speed of drive means and the power of said laser means.

4. Apparatus as defined by claim 3 wherein said monitoring means comprises a second laser means for generating a second laser beam and directing said second laser beam through said fiber, and optical receiver means for receiving said second laser beam after passing through said fiber and generating a signal indicative of fiber diameter.

5. Apparatus as defined in claim 4 wherein said optical receiver means detects fringes of light from said fiber.

6. Apparatus as defined by claim 5 wherein said first laser means includes a laser source, a laser beam attenuator for receiving and attenuating a laser beam from said laser source, a laser source power supply, and pyroelectric detector means responsive to said laser beam and generating a control signal for said power supply.

* * * * *